United States Patent [19]

Rice, Jr.

[11] Patent Number: 5,182,514

[45] Date of Patent: Jan. 26, 1993

[54] AUTOMATIC COMPENSATOR FOR AN AIRBORNE MAGNETIC ANOMALY DETECTOR

[75] Inventor: Joseph A. Rice, Jr., Plano, Tex.

[73] Assignee: Texas Instruments Incorporated, Dallas, Tex.

[21] Appl. No.: 525,340

[22] Filed: Nov. 19, 1974

[51] Int. Cl.$^5$ ............... G01R 33/028; G01R 33/022; G01R 33/24; G01R 33/18

[52] U.S. Cl. .................................. 324/244; 324/247

[58] Field of Search ............... 324/4, 7, 8, 244, 245, 324/246, 250, 257, 258, 247, 0.5 E; 235/151.3, 150.2

[56] References Cited

U.S. PATENT DOCUMENTS

| | | | |
|---|---|---|---|
| 3,441,841 | 4/1969 | Salvi et al. | 324/0.5 E |
| 3,530,375 | 9/1970 | Passier | 324/4 |
| 3,639,828 | 2/1972 | Salvi | 324/8 |
| 3,663,953 | 5/1972 | Salvi | 324/244 X |
| 3,679,969 | 7/1972 | Fussell | 324/244 |
| 3,697,869 | 10/1972 | Greenberg et al. | 324/244 X |
| 3,697,870 | 10/1972 | Brenner | 324/244 |
| 3,757,203 | 9/1973 | Salvi | 324/4 |
| 3,823,364 | 7/1974 | Cordelle et al. | 324/0.5 E |
| 3,870,973 | 3/1975 | Takeuchi et al. | 324/244 |

*Primary Examiner*—John B. Sotomayor
*Attorney, Agent, or Firm*—Rene' E. Grossman; Richard L. Donaldson

[57] ABSTRACT

A method and system for compensating maneuver induced components in the magnetic field sensed by an airborne magnetic detector. The magnetic fields sensed during a series of selected aircraft maneuvers are processed to yield signals representative of the magnetic properties of the aircraft. Subsequently, these signals are combined with signals representative of the aircraft attitude to provide a compensation signal. This compensation signal may be applied directly to the output of the magnetic detector or may be used to drive a set of compensation coils.

18 Claims, 5 Drawing Sheets

AUTOMATIC COMPENSATOR FOR AN AIRBORNE MAGNETIC ANOMALY DETECTOR

This invention relates to the reduction of noise in an airborne magnetic anomaly detector, and in particular to the compensation of detectors for magnetic fields induced by maneuvers of the aircraft.

A device which has been found to have particular utility in an antisubmarine warfare (ASW) context is the airborne magnetometer. These devices, sensitive to the absolute value and variations in the ambient magnetic field are extremely useful in the precise location and classification of unidentified submarines. Present day magnetometers such as the AN/ASQ-81 magnetometer system are highly sophisticated and extremely sensitive to small variations in the ambient magnetic field.

The problem addressed by the present invention stems from the high sensitivity of present day magnetometers and from the series of maneuvers which are typically performed by the aircraft in a practical application of the magnetometers. The aircraft carrying the magnetometer will itself produce small magnetic components which add to the ambient magnetic field to produce the net field sensed by the magnetometer. As the aircraft performs maneuvers, its contribution to the net magnetic field varies both in amplitude and in vector direction. As a result, the net magnetic field in the vicinity of the magnetometer will have a time varying component which is attributable solely to maneuvers of the aircraft. These "maneuver signals" are of sufficient amplitude to be detected by present day high sensitivity magnetometers. Since the frequency content of the maneuver signals may overlap the frequency band of signals produced by submarines, it is necessary to provide means for suppressing the maneuver signals.

Presently known systems for compensating maneuver signals include a plurality of coils located in the vicinity of the magnetometer. The coils are driven by currents which are controlled so as to produce, at the magnetometer, fields which are equal in amplitude and opposite in direction to the maneuver induced field components. In this way the maneuver signals are effectively cancelled thereby leaving the magnetometer sensitive only to variations in the ambient field.

The difficulty with this type of compensating system is the extensive amount of time required to set the system up so as to achieve acceptable compensation of maneuver signals. In order to adapt the compensating system to the individual magnetic properties of the particular aircraft involved, it is necessary for the aircraft to perform a series of special flight maneuvers. During these maneuvers trimming adjustment controls on the current driven coils are tuned so as to produce the necessary compensating fields. The set up process involves treating the various types of aircraft related sources sequentially and is very time consuming, typically requiring more than an hour for completion.

Unfortunately, a number of factors such as vibration, landing shock and dropping of stores may change the actual magnetic properties of the aircraft and require readjustment of the compensation system. This involves frequent recourse to the tedious and time consuming compensation flight sessions.

A second and related problem with presently available compensation systems stems from the fact that their effectiveness is closely related to the skill of an operator in setting up the system. As a consequence, these systems may frequently fail to perform in an optimum fashion.

The present invention comprises a unique method and system for compensation which substantially overcomes the aforementioned problems. It is known that the maneuver signals produced by the aircraft may be related to three basic physical phenomena: (1) permanent magnetization of portions of the aircraft structure, (2) induced fields produced by the interaction of the ambient magnetic field with soft magnetic materials in the aircraft and, (3) eddy current fields produced by eddy currents induced in the metallic structure of the aircraft (Paul Leliak "Identification and Evaluation of Magnetic Field Sources of Magnetic Airborne Detector Equipped Aircraft" IRE Transactions on Aerospace and Navigation Electronics, September, 1961). The instantaneous value of the projection on the earth's field vector of the fields produced by the aircraft may be conveniently described by a matrix formulation which involves the amplitude of the earth's field, the direction cosines of the ambient field vector relative to the aircraft coordinate system, and a series of 21 constant coefficients descriptive of the magnetic properties of the aircraft. These coefficients are constant in the sense that they do not vary as a function of the aircraft location or attitude. While the matrix formulation is conveniently expressed in terms of 21 coefficients, it is also known that only 16 of the coefficients are independent. Given the correct value of the 16 independent constant coefficients, determination of the instantaneous maneuver signal contribution to the net magnetic field sensed by the magnetometer requires only knowledge of the ambient field strength and its direction cosines relative to the aircraft coordinate system.

In the preferred embodiment of the invention the absolute value of the net magnetic field is provided to the compensator by a model AN/ASQ-81 helium resonance magnetometer. The magnetometer output, which is in the form of a frequency, is digitized by a frequency to digital converter (FDC). The output of the FDC is a digital time series representative of the instantaneous value of the total net field in the vicinity of the magnetometer. This digital time series is one input to a processor unit. A second input to the processor is provided by the vector magnetometer portion of a model AN/ASA-65. The three axis vector magnetometer provides to the processor the direction cosines of the earth's magnetic field relative to the three aircraft flight axes. A third input to the processor is provided by aircraft attitude sensors giving the instantaneous roll, pitch and yaw attitudes of the aircraft.

To calibrate the compensator the aircraft is caused to perform a specific maneuver such as a roll, pitch or yaw while flying a cardinal compass heading from the set north, east, south and west. The first maneuver, for example, may be a roll while flying a north compass heading. The specific time dependence of the roll maneuver will be designated by the function f(t). Under these conditions the maneuver signal produced in the output of the AN/ASQ-81 magnetometer may be described by a linear combination of four time functions. These four time functions are f(t) itself, the square of this function, the time derivative of this function, and finally the product of this function with its time derivative. The four coefficients in the linear combination are each a function of the 16 constant aircraft magnetic coefficients. Using the recorded maneuver signal from the AN/ASQ-81 magnetometer and the maneuver signal from the aircraft reference system the processor determines a least mean square error (LMSE) fit to the four coefficients.

This procedure is repeated for other maneuver/heading combinations and the four LMSE coefficients for each combination are determined by the processor, Then using the LMSE coefficients from an appropriate subset of the 12 possible maneuver/heading combinations the processor determines the 16 independent aircraft magnetic coefficients. This procedure for determining the 16 independent aircraft magnetic coefficients typically requires about 15 minutes of aircraft flight time. Further, the accuracy of the coefficient determination is independent of the skill of an operator.

After the 16 aircraft magnetic coefficients have been determined in the calibration mode, the compensation mode is effected in either of two ways. First, the 16 coefficients may be combined by the processor with the direction cosines of the earth's magnetic field. The direction cosines may be provided by the three axis magnetometer or alternatively be computed from the aircraft attitude signals and a known local dip angle. This combination is such as to produce a predicted maneuver signal which is subtracted from the digitized output of the AN/ASQ-81 magnetometer. Alternatively, the 16 aircraft magnetic coefficients may be employed by the processor to generate the current drive to a coil system to provide fields which null the maneuver induced fields in the vicinity of the magnetometer.

While the invention has been described in connection with an ASW airborne magnetometer system, it will be recognized by those skilled in the art that the invention also may be used in other contexts. Airborne magnetometer systems, for example, have been employed in geological exploration. As high sensitivity magnetometer systems are applied to the geological exploration problem it becomes necessary to compensate these systems for the effects of aircraft maneuver induced magnetic signals.

It will be seen from the foregoing that an object of the invention is to provide a new method and system for compensating the effects of maneuver induced noise in an airborne magnetic detector.

It is a further object to reduce the amount of flight time required in the calibration of a compensation system.

It is another object to provide a compensation method and system wherein the performance is substantially uniform and independent of the skill of an operator.

Other objects and features of the invention will be made clear by a consideration of the following detailed description in connection with the attached drawings wherein:

FIG. 1 relates the earth's magnetic field vector to the maneuver geometry of an aircraft.

Figure 1:
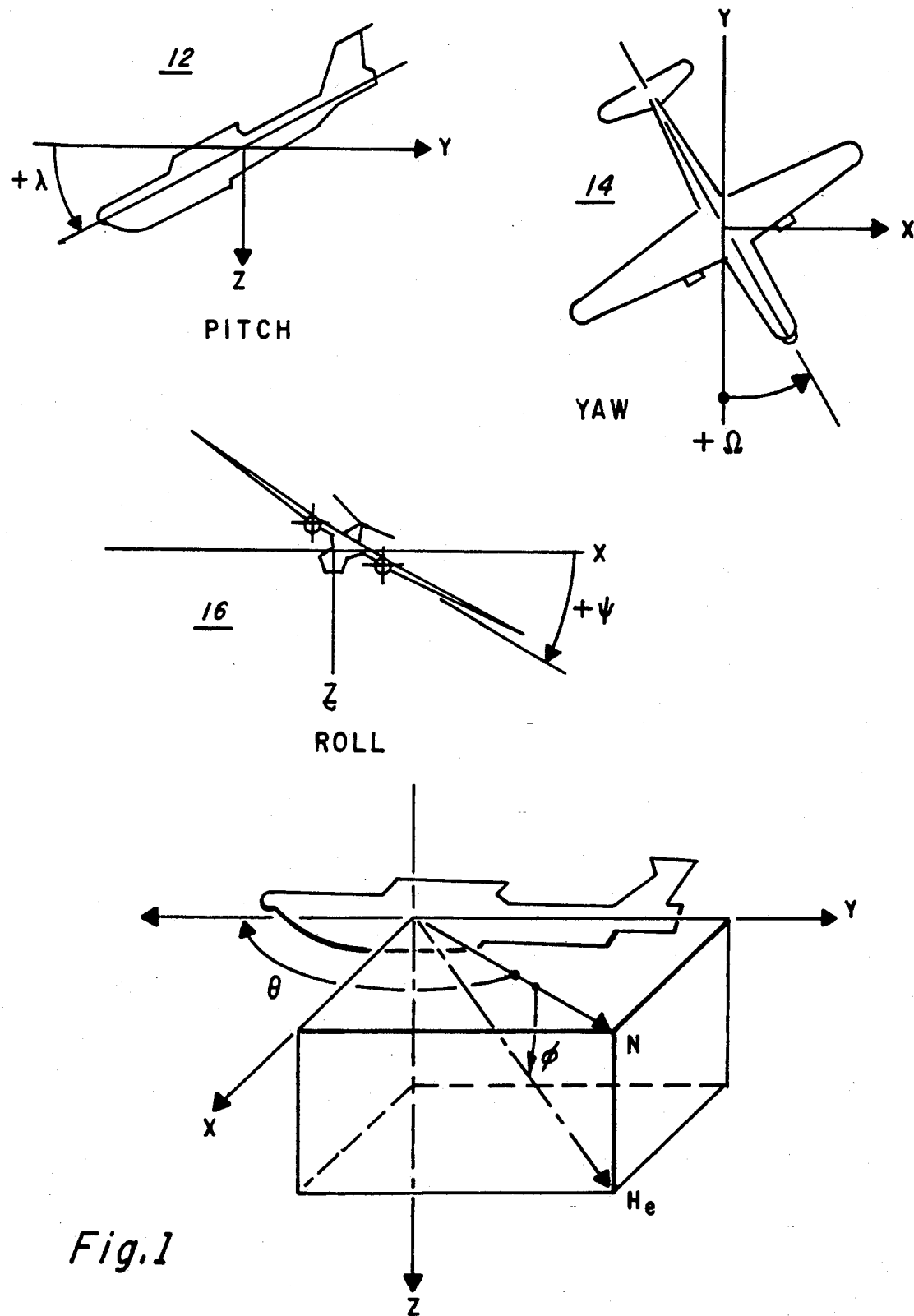

In FIG. 1 there are illustrated the various angular quantities which will be used in the theoretical description of the invention. In FIG. 1 at 10 there are shown the earth's field dip angle, $\phi$, and the aircraft heading angle, $\theta$. The earth's field vector, designated $H_e$, is seen to lie in a vertical plane passing through the aircraft and including a north directed vector. The earth's field dip angle, $\phi$, is the angle between the earth's field vector and this north vector, and is further seen to be positive when measured downward from the horizontal. The aircraft heading angle, $\theta$, is the angle in the horizontal plane between the north directed vector and the heading vector of the aircraft. The angle, $\theta$, is positive when measured clockwise from north.

In FIG. 1, at reference designators 12, 14 and 16, the three maneuver angles of the aircraft are defined. At 12 the pitch angle, $\lambda$, is seen to be measured from horizontal with a nose down attitude being considered positive. At 14 the yaw angle, $\Omega$, is seen to be the angle in the horizontal plane between the heading vector of the aircraft and the longitudinal axis of the aircraft. The angle, $\Omega$, is positive when the nose is left of the heading vector. At 16 the roll angle, $\psi$, is seen to describe departures of the transverse axis of the aircraft from the horizontal and is considered positive when the left wing is below the horizontal.

The maneuver signal contribution to the total magnetic field sensed by the magnatometer at any instant may be written as:

$$H_M(t) = H_P(t) + H_I(t) + H_E(t) \tag{1}$$

where $H_P(t)$ equals the projection at the detector along the earth's field vector of the field due to permanent magnetic inclusions, $H_I(t)$ equals the projection at the detector along the earth's field vector of the field due to induced magnetic sources, and $H_E(t)$ equals the projection at the detector along the earth's field vector of the field due to eddy current magnetic sources.

The three field projections of equation (1) may be expressed as functions of the direction cosines of the earth's field vector relative to the instantaneous aircraft coordinate system and of a set of constant coefficients descriptive of the aircraft magnetic profile. These relationships are:

$$H_P = [d]^T \begin{bmatrix} T \\ L \\ V \end{bmatrix} \tag{2}$$

$$H_I = H_e[d]^T \begin{bmatrix} TT & LT & VT \\ TL & LL & VL \\ TV & LV & VV \end{bmatrix} [d]$$

$$H_E = H_e[d]^T \begin{bmatrix} tt & lt & vt \\ tl & ll & vl \\ tv & lv & vv \end{bmatrix} [\dot{d}]$$

While each of the projections is a time dependent quantity as seen in equation (1), the time dependence has been suppressed in equation (2) in the interest of clarity. In equation (2) the quantity [d] is a three element column vector containing the direction cosines of the earth's magnetic field vector relative to the instantaneous aircraft coordinate system. The vector $[d]^T$ represents the transpose of the vector [d]. Finally the vector $[\dot{d}]$ represents a three component column vector containing the time derivatives of the three direction cosines. The quantity $H_e$ is the magnitude of the earth's magnetic field at the aircraft. In equation (2) the quantities T, L, and V are respectively the transverse, longitudinal, and vertical magnetic fields produced at the detector by permanent aircraft magnetic moments. In the induced magnetic moment expression of equation (2) the quantities within the 3×3 matrix are each constants of proportionality relating induced magnetic moment components to the resultant magnetic field components produced at the detector. The quantity TT, for example, gives the magnitude of the induced transverse field component produced at the detector per unit of transverse component of $H_e$. Similarly, by way of example, the quantity VT is the amplitude of the transverse induced field produced at the detector per unit of the vertical component of $H_e$. In the third expression of equation (2), giving the eddy current magnetic fields, the constants within the 3×3 matrix similarly relate components of eddy current magnetic moments to the resultant fields produced at the detector.

The three permanent magnetic moment terms, the nine induced magnetic moment terms, and the nine eddy current terms are each a constant, dependent solely on the magnetic profile of the aircraft, and invariant as a function of aircraft attitude. During the calibration of the compensator, the values of these constant coefficients are determined so as to permit subsequent generation of the compensation signals. In reality, expansion of the expressions in equation (2) will reveal that these coefficients may be combined in various ways such that there are only 16 independent coefficients which need be determined. In the preferred embodiment of the invention the 16 independent coefficients are T, L, V, TT- LL, LT+TL, VT+TV, VL+LV, VV-LL, tt-11, tl, tv, lt, lv, vt, vl, and vv-11.

To illustrate the determination of these constant magnetic coefficients in accordance with the principles of the invention, the vector of direction cosines may be related to the aircraft heading and maneuvers and the dip angle of the earth's magnetic field as follows:

$$[d] = [Q_M][R][d_o]; M = \lambda, \psi, \text{ or } \Omega \quad (3)$$
where $$[d_o] = \begin{bmatrix} \cos \phi \\ 0 \\ \sin \phi \end{bmatrix};$$

$$[R] = \begin{bmatrix} \sin \theta & \cos \theta & 0 \\ \cos \theta & -\sin \theta & 0 \\ 0 & 0 & 1 \end{bmatrix};$$

$$[Q_\lambda] = \begin{bmatrix} 1 & 0 & 0 \\ 0 & \cos \lambda & -\sin \lambda \\ 0 & \sin \lambda & \cos \lambda \end{bmatrix};$$

$$[Q_\psi] = \begin{bmatrix} \cos \psi & 0 & \sin \psi \\ 0 & 1 & 0 \\ -\sin \psi & 0 & \cos \psi \end{bmatrix};$$

$$[Q_\Omega] = \begin{bmatrix} \cos \Omega & \sin \Omega & 0 \\ -\sin \Omega & \cos \Omega & 0 \\ 0 & 0 & 1 \end{bmatrix}$$

The column vector [d0] will be recognized as comprising the three direction cosines of the earth's magnetic field vector relative to a north, east, down coordinate system. Premultiplication of this column vector by the R matrix effects a rotation of this coordinate system in the horizontal plane so that the north component is rotated into the aircraft heading direction, $\theta$. Finally, premultiplication by the appropriate $Q_M$ matrix accounts for the instantaneous value of the aircraft maneuver. In this way the [d] column vector is seen to be comprised of the three direction cosines of the earth's magnetic field vector relative to the instantaneous aircraft coordinate system.

For the purposes of calibrating the compensator, the R matrix and the [d₀] column vector may be considered to be constant as a function of time. It follows that the column vector [ḋ] containing the time derivatives of the direction cosines is given by:

$$[\dot{d}] = [\dot{Q}_M][R][d_o] \quad (4)$$

If the maneuver angles are relatively small (rolls at 10° and pitches and yaws 5° peak amplitude), then the following small angle approximations to the trigonometric functions of the maneuver angles may be used.

$$\sin M \approx M \quad (5)$$

$$\cos M \cong (1 - M/2^2) \quad (5)$$

The use of these small angle approximations considerably simplifies the computations.

If equations (3), (4), and (5) are substituted in equation (2), and the indicated matrix algebra is performed, the maneuver signals for a single maneuver on a cardinal heading produced by permanent and induced inclusions are represented by:

$$H_P + H_I = \sum_{k=1}^{2} A(i,j,k) \cdot F(k,t), \quad (6)$$

and the eddy current components are represented by:

$$H_E = \sum_{k=3}^{4} A(i,j,k) \cdot F(k,t) \quad (7)$$

In equations (6) and (7) the A(i,j,k) are intermediate constant coefficients with the i's designating aircraft heading according to the convention 1-north, 2-east, 3-south, 4-west, and the j's designating aircraft maneuvers according to the convention 1-rolls, 2-pitches, and 3-yaws. For each specific cardinal heading and aircraft maneuver there are four intermediate constant coefficients, each being a function of the aircraft heading angle $\theta$, the earth's magnetic field dip angle $\phi$ and the 16 constant magnetic coefficients of the aircraft. Since the 16 constant magnetic coefficients of the aircraft are unknown prior to the calibration procedure, it follows that the A(i,j,k) are also unknown coefficients to be solved for. In equations (6) and (7) the F(k,t) are defined as follows:

$$F(1,t) = f(t) \quad \text{(the maneuver time function)} \tag{8}$$
$$F(2,t) = f^2(t)$$
$$F(3,t) = \dot{f}(t) \quad \text{(the time derivative of } f(t)\text{)}$$
$$F(4,t) = f(t) \cdot \dot{f}(t)$$

In equation (8) f(t) may be either $\lambda$, $\psi$ or $\bullet$ in accordance with the value of j in equations (6) and (7).

Substitution of equations (6) and (7) in equation (1) yields:

$$H_M(t) = \sum_{k=1}^{4} A(i,j,k) \cdot F(k,t) \tag{9}$$

for any specific single maneuver along a cardinal aircraft heading, as defined by the specific values of i and j, the maneuver signal $H_M(t)$ is given by a linear combination of the four intermediate constant coefficients. The F(k,t) are known quantities since (F(l,t) is provided by the aircraft reference system and the other F(k,t) are derivable therefrom. The value of $H_M(t)$ is also a known function of time, this being provided by the AN/ASQ-81 magnetometer. Thus, one way to determine the values of the A(i,j,k) corresponding to a given maneuver and aircraft heading would b to sample the H and F functions at four instants in time and substitute these values in equation (9) thus providing four simultaneous linear equations in the four unknown A coefficients. In view of the statistical variability of the H and F functions, however, the A coefficients obtained from such a procedure would be highly unstable.

In the preferred embodiment of the invention this instability is overcome by sampling the H and F functions N times where N is greater than 4, N=125 being a typical value. This yields N equations in the four unknown A coefficients. In the preferred embodiment these equations are used to provide a least mean square error (LMSE) determination of the four A constant coefficients.

Also in the preferred embodiment the form of equation (9) is expanded to account for the fact that the magnetometer which provides the samples of $H_M(t)$ is measuring the earth's magnetic field as well as maneuver induced magnetic field variations. Accordingly, the equation actually used in the LMSE determination is the following:

$$H_M(t) = \sum_{K=1}^{4} A(i,j,k) \cdot F(k,t) + \sum_{p=0}^{2} A(i,j,p+5)t^p \tag{10}$$

The additional terms in equation 10 comprise a power series in the time variable, t, and serve to describe the earth's magnetic field component in the magnetometer output. The order of the highest order term in this power series is a matter of design choice, the use of the quadratic and lower order terms having been found to produce acceptable results.

It will be recognized by those skilled in the art that a LMSE solution of the system of equations 10 is provided by:

$$[A(i,j)] = [[P]^T [P]]^{-1} [P]^T [S(i,j)] \tag{11}$$

where [A(i,j)] is a seven element column vector containing the individual values of the A(i,j,k), and S(i,j) is an N element column vector containing N time samples of $H_M(t)$ recorded while the aircraft was performing maneuver j along heading i. The P matrix in equation (11) has the form:

$$\begin{pmatrix} F(1,t_1) & F(2,t_1) & F(3,t_1) & F(4,t_1) & t_1^2 & t_1 & 1 \\ F(1,t_2) & F(2,t_2) & F(3,t_2) & F(4,t_2) & t_2^2 & t_2 & 1 \\ \cdot & \cdot & \cdot & \cdot & \cdot & \cdot & \cdot \\ \cdot & \cdot & \cdot & \cdot & \cdot & \cdot & \cdot \\ \cdot & \cdot & \cdot & \cdot & \cdot & \cdot & \cdot \\ F(1,t_N) & F(2,t_N) & F(3,t_N) & F(4,t_N) & t_N^2 & t_N & 1 \end{pmatrix} \tag{12}$$

The LMSE determination given by equation (11) provides a stable set of intermediate constant coefficients, A, corresponding to maneuver j along aircraft heading i. This procedure is repeated for each of the other cardinal aircraft headings and maneuvers to provide corresponding sets of the A coefficients.

It will be recalled that each of the A coefficients is a function of the aircraft heading, $\theta$, and the earth's magnetic field dip angle, $\phi$, both of which are known, and of the 16 independent constant magnetic coefficients of the aircraft. Once having determined the values of the A intermediate coefficients, they may be used to solve for the 16 independent constant magnetic coefficients. This procedure for moderate dip angles has been found to be:

$$TL + LT = [A(1,1,1) - A(3,1,1)]/H_e \sin 2\phi \tag{13}$$
$$T = [A(2,1,1) + A(4,1,1)]/2 \sin \phi$$
$$TV + VT = [A(1,1,1) + A(3,1,1) - 2T\sin\phi]/2H_e \sin^2 \phi$$
$$V = [A(3,2,1) - A(1,1,1)]/2 \cos \phi$$
$$LV + VL = [A(2,2,1) + A(4,2,1) - A(1,2,1) - A(3,2,1)]/\cos^2 \phi$$
$$VV - LL = [A(3,2,1) - A(1,2,1) - 2V\cos\phi]/2H_e \sin\phi$$
$$TT - LL = [2V\cos\phi - A(4,1,1) + A(2,1,1)]/2H_e \sin 2\phi + (VV - LL)$$
$$tl = [A(1,1,3) - A(3,1,3)]/H_e \sin^2 \phi$$
$$tv = [A(1,1,3) + A(3,1,3)]/2H_e \sin^2 \phi$$
$$lv = [A(2,2,3) + A(4,2,3)]/2H_e \sin^2 \phi$$
$$vl = [lv \sin^2 \phi - A(1,2,3) + A(3,2,3)/H_e]/2 \cos^2 \phi$$
$$vv - ll = [A(3,2,3) - A(1,2,3)]/H_e \sin 2\phi$$
$$tt - ll = [A(2,1,3) - A(4,1,3)/H_e \sin 2\phi] + (vv - ll)$$
$$lt = [\{A(2,2,3)\} - A(4,2,3)]/H_e \sin 2\phi$$
$$vt = [2tv \sin^2 \phi - \{A(2,1,3) + A(4,1,3)\}/H_e]/2 \cos^2 \phi$$
$$L = [A(2,2,1) + (r,2,1) - 2H_e(LV + VL) \sin^2 \phi]/2 \sin \phi$$

Inspection of this solution set reveals that the intermediate A coefficients corresponding to yaw maneuvers are not required. Thus, it will be seen that in the preferred embodiment of the invention, the need to perform yaw maneuvers during the calibration of the compensation system is eliminated. With the determination of the 16 aircraft magnetic coefficients the calibration of the compensation system is complete.

By combining equations (1) and (2) it will be seen that the negative of the maneuver signal generated by aircraft maneuvers is given by:

$$\begin{aligned} C(t) = & -T\cos x - L\cos y - V\cos z - \\ & H_e[(TT - LL)\cos^2 x + (LT + TL)\cos x \cos y + \\ & (VT + TV)\cos x \cos z + (VL + LV)\cos y \cos z + \\ & (VV - LL)\cos^2 z + (tt - ll)\cos x \cos x + lt \cos x \cos y + \\ & vt \cos x \cos z + tl \cos y \cos x + vl \cos y \cos z + \\ & tv \cos z \cos x + lv \cos z \cos y + (vv - ll) \cos z \cos z] \end{aligned} \tag{14}$$

where the three elements of the column vector, [d], are the direction cosines of the earth's magnetic field with respect to the coordinate system of the aircraft, and are given in equation (14) as cos x, cos y, and cos z. The constants in equation (14) are all known, having been determined during the calibration procedure. The absolute value of the earth's magnetic field, $H_e$, is continuously provided by the total field magnetometer which is to be compensated. The direction cosines are continuously provided by the three component vector magnetometer. The combination of these quantities, as given by equation (14), permits the continuous generation of a signal, C(t), which in theory is the negative of the maneuver induced signal appearing in the output of the total field magnatometer. The quantity, C(t), is added to the output of the magnetometer, thereby resulting in substantially total cancellation of the maneuver induced signal.

As an alternative to the procedure just described it is possible to use the 16 independent aircraft magnetic coefficients determined during the calibration phase to drive a system of three orthogonal coils located in the vicinity of the total field magnetometer. The coils are driven in a manner so as to produce a magnetic field in the vicinity of the magnetometer which substantially cancels maneuver induced magnetic field components.

Whereas the invention has been described up to this point in terms of its theoretical basis, a detailed description of the preferred embodiment will next be presented.

Figure 2:
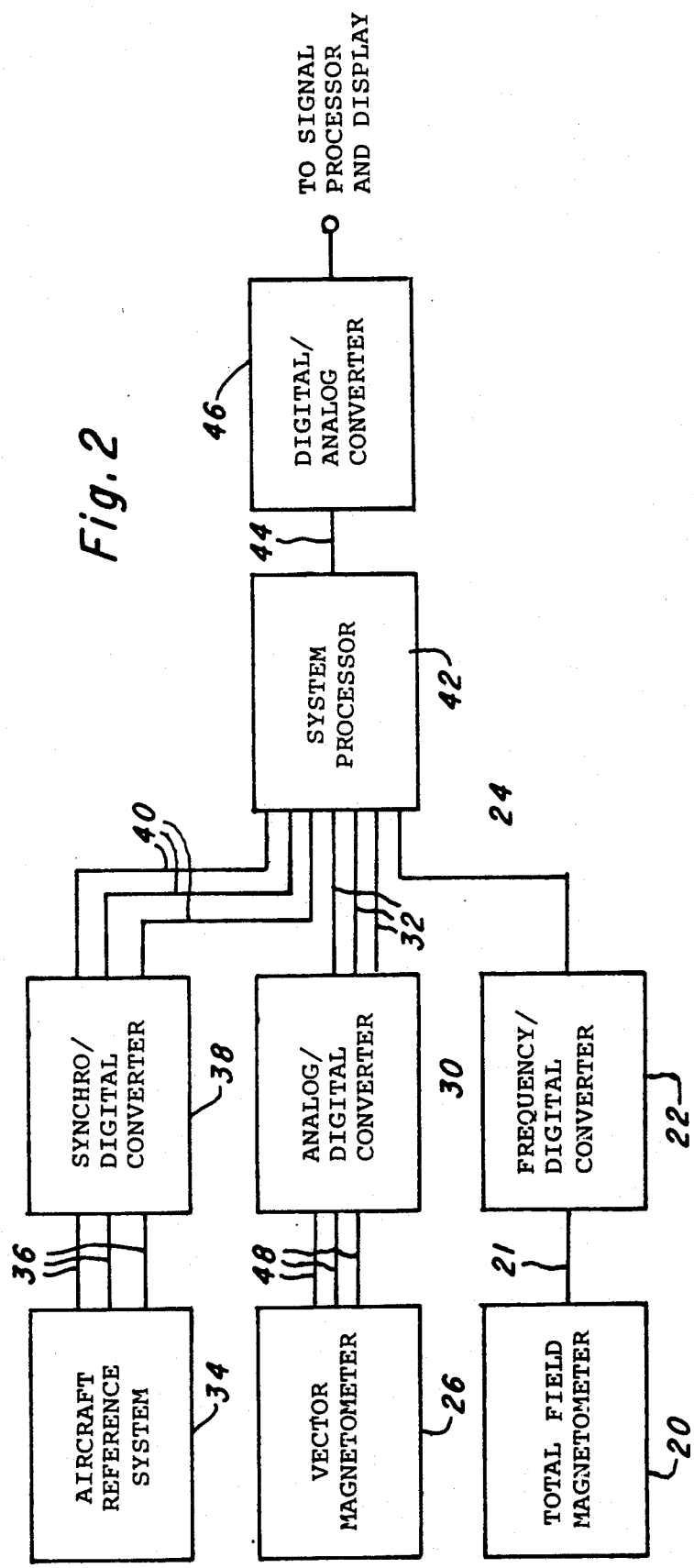
FIG. 2 is a block diagram of the compensator system.

FIG. 2 is a block diagram showing the various components comprising the preferred embodiment of the invention. A total field magnetometer 20 is located in an aircraft and produces signals representative of the ambient magnetic field. The magnetometer employed in the preferred embodiment of the invention is a model AN/ASQ-81 helium resonance magnetometer. Its output is a CW signal having an instantaneous frequency which is directly proportional to the sensed magnetic field strength. This CW signal is coupled to frequency/digital converter 22 by line 21. The output of frequency/digital converter 22 is a digital time series representative of the sensed magnetic field strength. Frequency/digital converter 22 may be a model 5360A Computing Counter System manufactured by Hewlett Packard Company of Palo Alto, Calif. Alternatively, it may be a novel frequency/digital converter which is the subject of copending U.S. patent application, Ser. No. 178,132, filed Sep. 7, 1971, and entitled "Sampled Data Frequency To Digital Converter". The output of the converter is coupled to a system processor 42 by line 24. A three-component vector magnetometer 26 is also located in the aircraft and has its three sensitive axes aligned with the principle axes of the aircraft. A suitable vector magnetometer is included in the model AN/ASA-65 compensation system. The three analog outputs of the vector magnetometer 26, representing the three components of magnetic field strength, are coupled by lines 28 to analog/digital converter 30. Here the three magnetic components are time division multiplexed, digitized, and then coupled to the system processor 42 on lines 32. A suitable analog/digital converter is the model MADC-11-1 produced by DDC, a Division of Solid State Scientific Device Corporation, Hicksville, N.Y. The multiplexer is a model MMUX-1, also a product of DDC. An aircraft reference system 34 provides signals representative of the instantaneous heading, pitch, and roll attitude of the aircraft. Various types of aircraft reference systems may be employed here, a suitable one being the model CN-1231/ASN-84 gyroscope assembly. The three outputs of the aircraft reference system 34 are coupled by lines 36 to a synchro/digital converter 38 wherein the signals are digitized. The three outputs of the synchro/digital converter 38 are coupled by lines 40 to system processor 42. A suitable synchro/digital converter is the model ESDC-6-1, also produced by DDC.

System processor 42 has two modes of operation. During the calibration mode it combines the digitized output of the aircraft reference system 34, vector magnetometer 26 and total field magnetometer 20 so as to produce a plurality of electrical signals representative of the 16 independent magnetic coefficients of the aircraft. These electrical signals are stored in the system processor 42 for subsequent use during the compensation mode of operation.

During the compensation mode, system processor 42 combines the 16 constant magnetic coefficients of the aircraft with the digitized outputs of vector magnetometer 26 and total field magnetometer 20 so as to produce a compensated total field magnetometer signal. System processor 42 may comprise a programmed general purpose digital computer. A model 2520 digital computer manufactured by Texas Instruments Incorporated of Dallas, Tex. is used in the preferred embodiment of the invention. The compensated magnetometer signal produced by system processor 42 is coupled by line 44 to digital/analog converter 46 which produces the corresponding analog signal for subsequent processing and display. A suitable digital/analog converter is model ZD432 manufactured by Zeltex Inc. of Concord, Calif.

Figure 3:
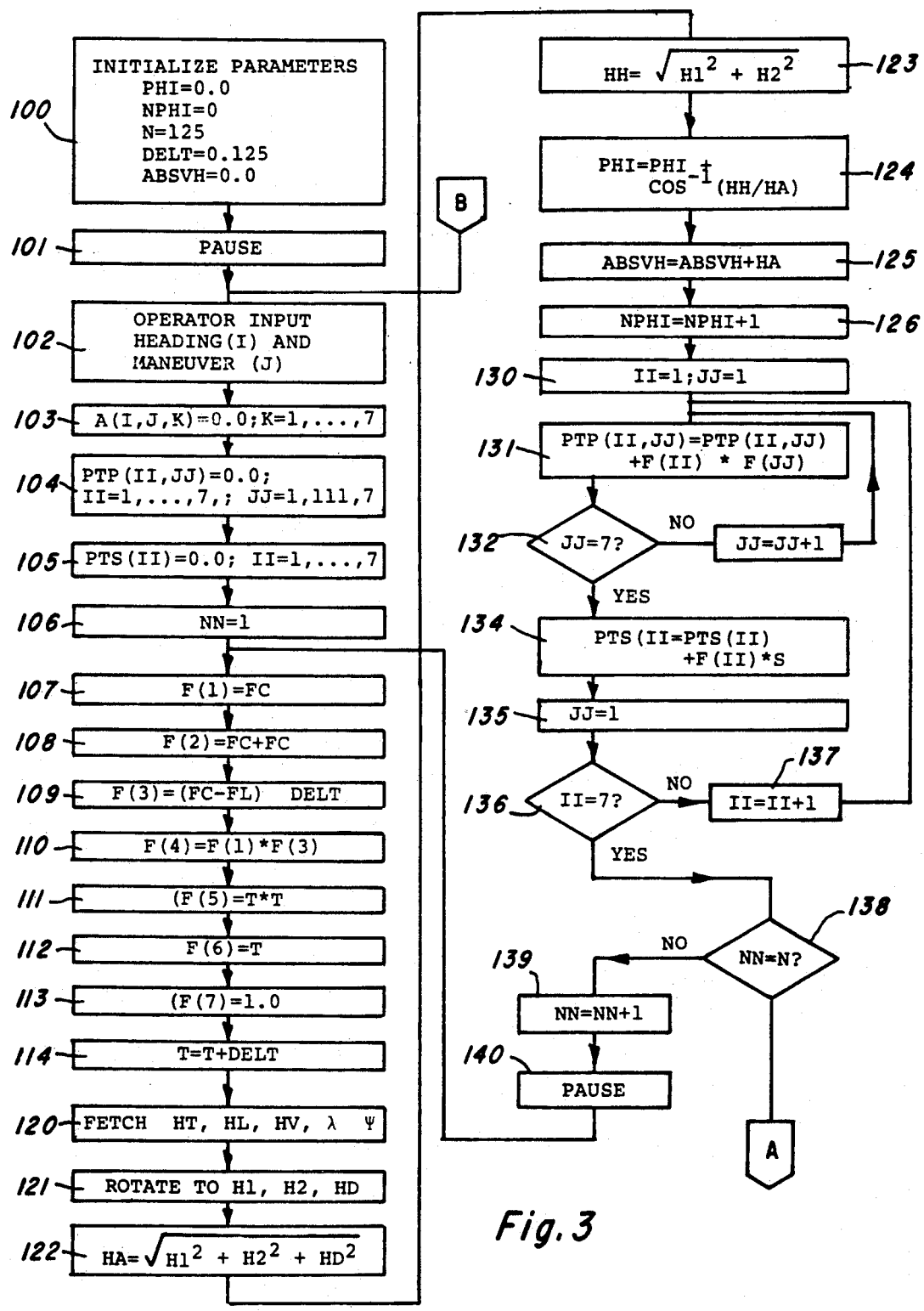
FIGS. 3 and 4 are a flow chart showing the system processor in the calibration mode.

The operation of system processor 42 during the calibration mode may be illustrated with reference to the flow chart of FIGS. 3 and 4. At the outset, as indicated in Block 100, various parameters are initialized. Among these are a variable PHI, which will be used to accumulate a summation of samples of the dip angle. The variable, NPHI, is a counter which will be used to count the number of samples in the PHI summation. The definition of the matrix P, given in equation (12), shows the significance of the variable N. By way of example this variable is given the value 125 in FIG. 3. After initialization of parameters, the processor pauses at 101 to await intervention by an operator. At this point the aircraft- will begin flying a specific maneuver along a cardinal heading. At 102 the operator will input a number (I) indicative of this heading and a number (J) indicative of the maneuver. In the preferred embodiment the convention used for I is 1-north, 2-east, 3-south, and 4-west, while the convention adopted for the J value is 1-roll and 2-pitch. The flow then proceeds to step 103 where the A coefficients corresponding to heading I and maneuver J are set to 0. At 104 the elements of a 7×7 matrix, PTP, are set to zero. This matrix will be used to accumulate the matrix product $[P]^T[P]$ appearing in equation (11). At 105 a seven element column vector, PTS, is set to zero. This column vector will be used to accumulate the matrix product $[P]^T[S(i,j)]$ appearing in equation (11). At 106 a counter NN is set to 1. This counter counts the number of data samples used in the LMSE solution for the A coefficients. In other words, it counts the number of rows used in the matrix P as defined by equation (12).

At steps 107–113 the seven elements appearing in the first row of the matrix P are computed, these elements in the flow chart being indicated by F(K) where K ranges from 1 to 7. The variable FC appearing in steps 107 through 113 is the current value of the relevant maneuver signal. When the maneuver designator J, input at step 102, has the value 1, indicating a roll maneuver, the variable FC is the current sample of the roll signal provided by aircraft reference system 34. When J has the value 2, indicating a pitch maneuver, FC will be the current sample provided by the pitch sensor of the aircraft reference system. At all times, system processor 42 will contain the current value of the relevant maneuver sample, FC, as well as the most recent previous value, FL. This permits computation of a two term approximation to the derivative of the maneuver function at 109. Other approximations to the derivative, using more terms may be used here without departing from the scope of the invention. At 114 the time quantity T is incremented by the sampling interval, DELT, in preparation for computation of the next set of F functions.

Steps 120-125 serve to update a running average of the dip angle $\phi$, represented in the flow chart by PHI. The ultimate average value is used at a later point in the flow for computing the 16 independent magnetic coefficients of the aircraft. Step 120 indicates the quantities which are used in the computation. The three current samples produced by the vector magnetometer HT, HL and HV give the values of the earth's magnetic field components along the transverse, longitudinal and vertical axes of the aircraft. The current sample of the aircraft pitch, $\lambda$, and roll, $\psi$, are also used in the computation. It will be recalled that the dip angle, $\phi$, is the angle that the earth's magnetic field vector makes with the horizontal. Accordingly, at 121 the three magnetic field components are rotated to a coordinate system which contains two horizontal orthogonal components, H1 and H2, and a vertical component HD. For the purposes of the present computation, it is not necessary that the horizontal components be aligned with any particular axis, it being sufficient that they are orthogonal and in the horizontal plane. At 122 the absolute value, HA, of the earth's magnetic field is determined. Similarly, at 123 the absolute value of the horizontal component of the earth's magnetic field, HH, is determined. The instantaneous value of the dip angle then is the ARCCOS (HH/HA), this quantity being used at 124 to update the running average of PHI. At 125, ABSVH, a running average of the absolute value of the earth's field, is updated. At 126 the counter NPHI, which counts the number of samples going into the running average of PHI, is incremented.

At 130 a row counter, II, and column counter, JJ, for the matrix PTP are initialized to one. It will be recalled that the matrix PTP is the result of premultiplying the matrix P by its own transpose. Consideration of the definition of the matrix P in equation 12 will show that the resultant matrix, PTP, is a 7×7 square matrix. Moreover, each element in the matrix includes contributions from each time sample of the F functions. At the first pass through that portion of the flow comprising steps 130 through 137, the contributions from the first time sample of the F functions are accumulated into the matrix, PTP, as well as the column vector, PTS. Contributions from later time samples of the F functions are accumulated into the matrix and column vector at later passes through this portion of the flow, under control of the counter NN. When the value II is one, the program loops through steps 131, 132 and 133 to accumulate a value into each element of row 1 under control of column counter JJ. At 134 a value is accumulated into the first element of column vector PTS by forming the product of F(1) with the quantity S which is the current sample produced by the total field magnetometer. At 135 the column counter JJ is reinitialized to one and the flow continues through the outer II loop until all the rows of the matrix and column vector have been accumulated. At step 138 the counter NN is tested to determine whether the desired number of time samples has been accumulated into the PTP matrix and PTS column vector. In the example illustrated by FIG. 3, the value N is 125. If NN is less than 125 this counter is incremented at 139 and the flow encounters a pause at 140. The purpose of the pause at step 140 is to synchronize the flow with the desired data sample rate DELT. The flow ceases at 140 until a signal is received indicating that the next data sample has been received by system processor 42. At this time the flow proceeds to step 107 to initiate the next pass through the matrix accumulation loop.

Figure 4:
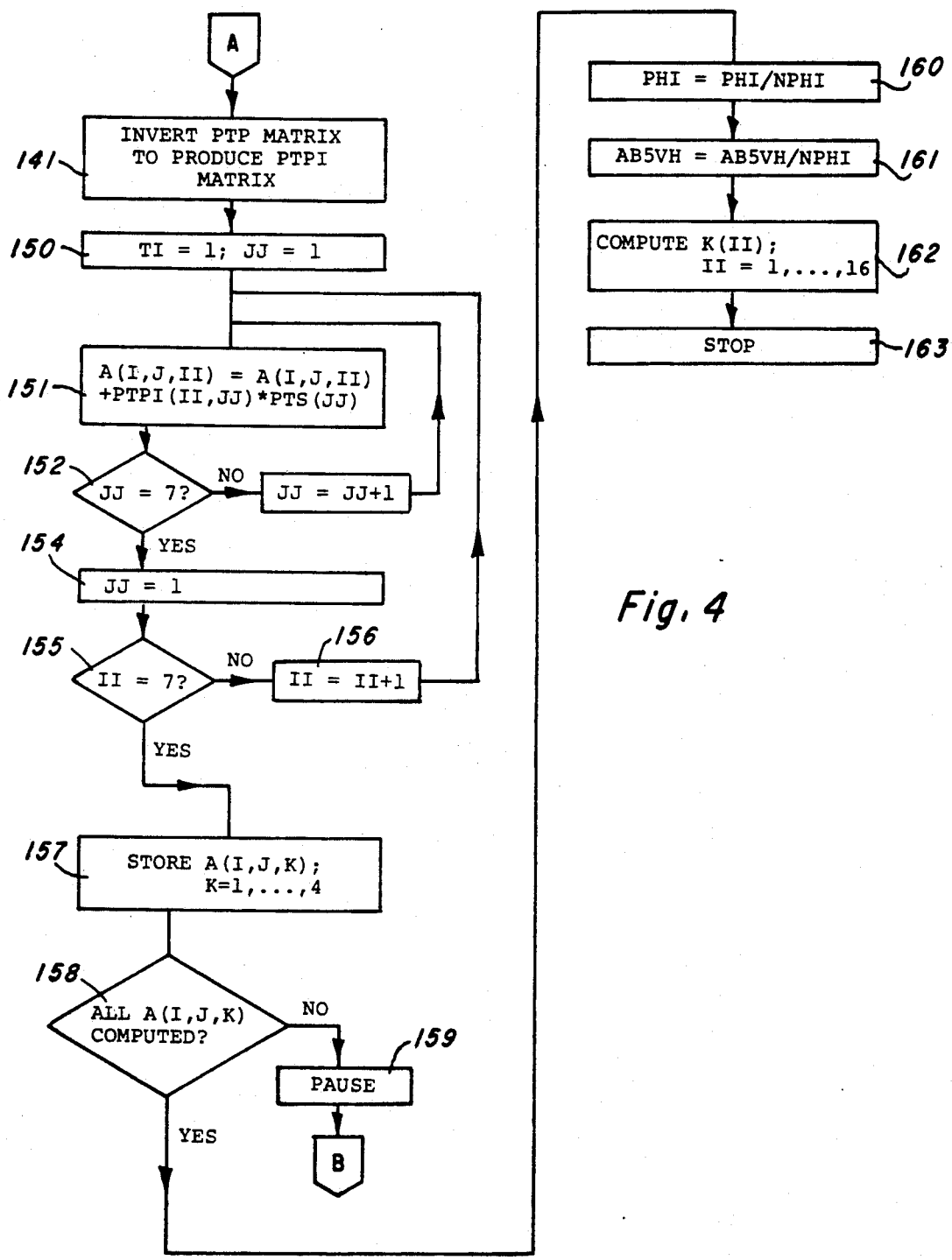

When the test at step 138 indicates that the last set of data has been accumulated into the matrix, the flow leaves the matrix accumulation loop and proceeds to step 141 of FIG. 4. Equation (11) shows that the PTP matrix must be inverted prior to computation of the A values. This inversion is performed at step 141 with the inverse matrix being labeled PTPI in the flow chart. At steps 150 through 156 the matrix product of the PTPI matrix and the PTS column vector is formed to yield the A values. When the counter II has the value 1, the flow loops through steps 151, 152 and 153 to accumulate the products which form the first element of the A vector for heading I and maneuver J. After accumulation of this value, the flow proceeds through the outer loop at steps 154, 155 and 156, under control of counter II and returns to compute the next A value. After all the A values have been computed for this heading and maneuver, flow leaves the loop at step 155 and at step 157 the first four A coefficients corresponding to heading I and maneuver J are stored for subsequent use. At 158 a test is performed to determine whether or not the A coefficients corresponding to all headings and maneuvers have been computed. If not, the flow pauses at 159 and awaits operator intervention at step 102 of FIG. 3 to indicate that the aircraft is now flying a new heading I and maneuver J.

After the last A coefficients have been computed, flow proceeds to step 160 where the accumulated sum of PHI values is divided by the number of samples that went into the sum, NPHI. Similarly, at 161 the accumulated sum of magnetic field absolute values, ABSVH, is divided by the number of samples going into the sum. At 162 the 16 independent aircraft magnetic coefficients are computed. Step 162 is simply the implementation of the relationships shown in equation (13). In equation (13) the quantity $H_e$ is the value determined at step 161 of the flow. Similarly, the angle $\phi$ is the quantity PHI determined at step 160 of the flow. Computation of the 16 independent magnetic coefficients concludes the calibration mode of operation and the flow stops at step 163.

Figure 5:
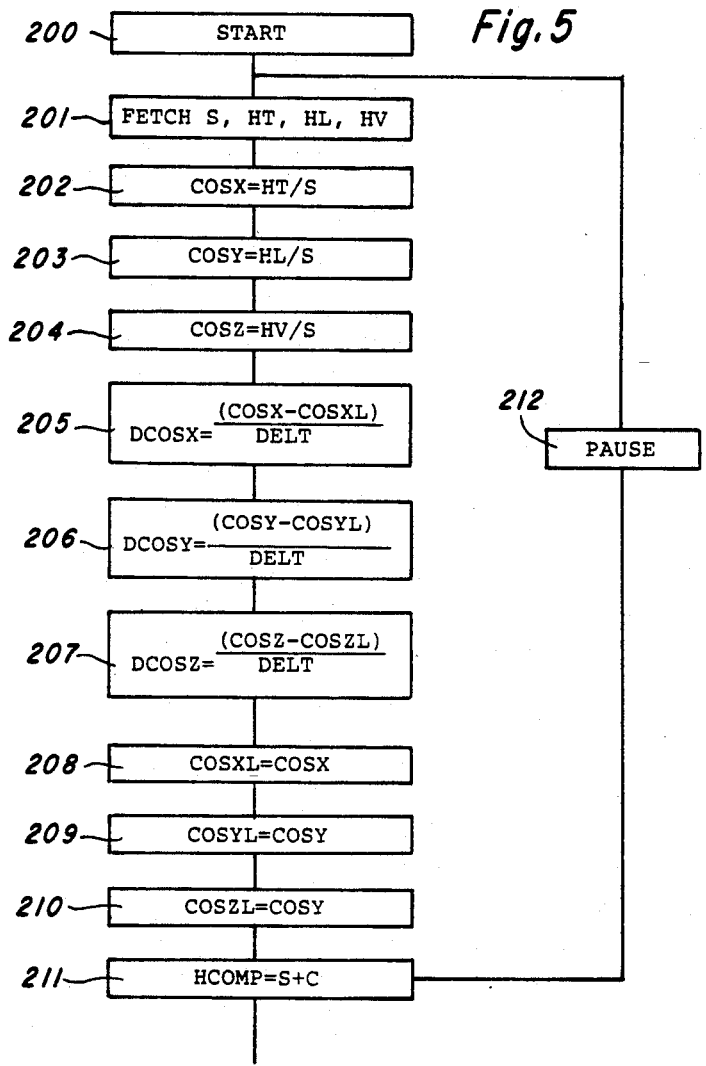
FIG. 5 is a flow chart of the system processor in the compensation mode.

The operation of system processor 42 during the compensation mode of operation is illustrated by the flow diagram of FIG. 5. The flow starts at step 200. At 201 the data quantities used in the compensation are shown to be the current sample, S, produced by the total field magnetometer and the three current samples of the magnetic field components produced by the vector magnetometer HT, HL and HV. In steps 202, 203 and 204 the direction cosines of the earth's magnetic field relative to the aircraft coordinate system are computed. In each case the direction cosine is the quotient of the corresponding magnetic field component to the value of the total field. At steps 205 through 207 the derivatives of these direction cosines are computed. In each case the approximation used to the derivative is the difference between the present value of the direction cosine and its most recent value, this difference being divided by the sample period, DELT. At steps 208-210 the current values of the direction cosines are stored into the array of most recent values of the direction cosines for use as most recent values during the next pass through the loop. At step 211 the current sample of the compensated total magnetic field is formed by adding the compensation term, C, to the current sample of uncompensated total magnetic field S. The compensation term, C, is defined in equation (14). The quantities appearing in equation (14) are the sixteen independent aircraft magnetic field coefficients which were determined during the calibration mode of operation; $H_e$, the current value of uncompensated total magnetic field, which in the flow chart appears as the value S; the three direction cosines which are determined at steps 202-204; and the derivatives of these direction cosines which are determined at steps 205-207. The current compensated value is output to digital/analog converter 46 which produces a continuous analog function representative of the compensated total magnetic field. The flow proceeds to step 212 where it pauses awaiting an indication that the next new data sample has been received. At this point flow returns to step 201 to compute the next compensated data value.

While a preferred embodiment of the compensation mode portion of the invention has been disclosed, an alternative embodiment of this portion of the system is possible. An understanding of the alternative system is facilitated by a rearrangement of the compensation signal of equation (14) as it appears in equation (15).

$$C(t) = -\{T + H_e[(TT - LL)\cos x + lt \cos y + \\ vt \cos z + (tt - ll)\cos x]\} \cos x - \{L + H_e[(TL + LT)\cos x + \\ (LV + VL)\cos z + tl \cos x + vl \cos z]\} \cos y - \\ \{V + H_e[(TL + VT)\cos x + (VV - LL)\cos z + lv \cos y + \\ (vv - ll)\cos z + tv \cos x]\} \cos z \quad (15)$$

In equation (15) it will be seen that the compensation signal comprises three components, the first of which includes a plurality of terms all of which are multiplied by cos x; the second of which includes a plurality of components all of which are multiplied by cos y; and the third of which includes a plurality of components all of which are multiplied by cos z. In equation (15), C(t) is the negative of the projection of the maneuver induced magnetic field components on the earth's field vector. In the alternative embodiment a set of coils is driven by currents so as to produce, at the magnetometer, a magnetic field having a projection along the earth's magnetic field equal to the field represented by C(t).

Figure 6:
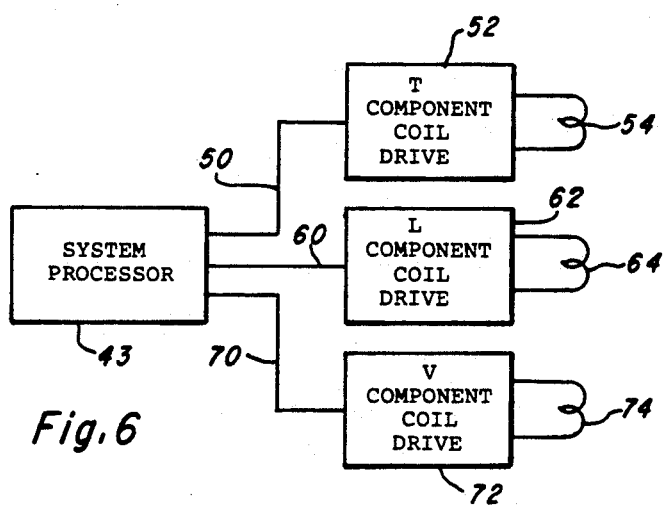
FIG. 6 shows an alternative embodiment for the compensation mode.

This system is illustrated in FIG. 6. A coil 54 is located in the vicinity of the total field magnetometer and is oriented so as to produce, at the magnetometer, a magnetic field proportional to the current flowing in the coil and oriented in the direction of the transverse axis of the aircraft. Coils 64 and 74 function in a similar manner but are oriented so as to produce fields, at the magnetometer, oriented in the directions of the longitudinal and vertical axes of the aircraft, respectfully.

System processor 43 produces on line 50 a digital time series containing sampled values of the coefficient of cos x in equation (15). In other words, the digital time series appearing on line 50 is representative of the quantity:

$$-\{T + H_e[(TT - LL) \cos x + lt \cos y \\ + vt \cos z + (tt - ll) \cos x]\} \quad (16)$$

T component coil drive 52 contains a digital/analog converter which produces an analog signal corresponding to the digital time series on line 50. This analog signal is amplified in a driver amplifier which produces a current in coil 54 proportional to the analog signal. Accordingly, it is seen that the current flowing in coil 54, and consequently the transverse component magnetic field produced at the magnetometer, is proportional to the quantity appearing in equation (16) above. The component of this field projecting on the earth's magnetic field and hence sensed by the total field magnetometer is the product of the field produced by coil 54 with the direction cosine of the earth's field relative to the transverse axis of the aircraft. This direction cosine is cos x appearing in equation (15). It will be seen, therefore, that the magnetic field generated by coil 54 has a projection on the earth's magnetic field which is directly proportional to the first complete term of equation (15).

In a similar manner, the digital time series produced by system processor 43 on line 60 represents the value of the coefficient of cos y in equation (15) and the digital time series appearing on line 70 represents the value of the coefficient of cos z in equation (15). Accordingly, coils 64 and 74 produce fields having projections along the earth's magnetic field which are directly proportional to the second and third complete terms respectively in equation (15). The constants of proportionality are controlled by the drive amplifiers and are selected so that net field component produced along the earth's magnetic field vector has exactly the value C(t). Thus, the system of the alternative embodiment produces a field at the magnetometer which exactly cancels the predicted maneuver induced magnetic field.

In generating the digital time series on lines 50, 60 and 70, system processor 43 utilizes the 16 independent aircraft magnetic field coefficients determined during the calibration mode of operation. As before, the value of the earth's magnetic field, $H_e$, is provided by the total field magnetometer. The three components of the earth's magnetic field relative to the aircraft coordinate axes are provided by the three-axis vector magnetometer and are used, just as in FIG. 5, to compute the direction cosines and their derivatives. The system processor combines these various quantities to produce the appropriate time series on lines 50, 60 and 70, all as indicated by equation (15) and the previous discussion.

The digital/analog converter used in each coil drive may be the aforementioned model ZD432 produced by Zeltex Incorporated of Concord, Calif. The drive amplifier used in each coil drive is a conventional power amplifier capable of being driven by the digital/analog converter and of providing sufficient drive current in the coils. Each of coils 54, 64 and 74 may comprise a single or multiple loop of wire lying in a plane perpendicular to its magnetic axis. In other words, coil 54, which is to produce a magnetic field component along the transverse axis of the aircraft, would lie in the longitudinal-vertical plane of the aircraft. Each coil is located so that the axis through its center and perpendicular to the plane of its loop of wire passes through the total field magnetometer.

While the preferred embodiment of the invention has been disclosed certain modifications thereto may suggest themselves to those skilled in the art. In the preferred embodiment, for example, only one set of A coefficients is determined for each maneuver and heading. A type of quality control may be realized by repeating the determination of the A coefficients for each maneuver and heading. With each repetition a current average is obtained for each A coefficient. For each maneuver and heading two sets of A coefficients are compared, the current average and the next most recent average, and if their difference exceeds a predetermined threshold, the determination is performed a third time and the progressive current average of the A values computed. This process is repeated continuously until the difference between the current average value of the A coefficients and the next most recent average is less than the threshold value or until an iteration counter exceeds a predetermined number indicating that this computed difference has failed to converge to the required threshold.

It should also be noted that the particular set of A coefficients used in the determination of the 16 aircraft magnetic coefficients as given by equation (13) is only a representative set. A large variety of such sets of relationships are possible and in any given situation the preferred set is, inter alia, a function of the particular aircraft involved. In another embodiment of the invention it may be desirable to determine and use a separate set of sixteen aircraft magnetic coefficients for each cardinal compass heading or for each 90° sector of compass headings.

Although a detailed description of a preferred embodiment of this invention has been described, it will be apparent to a person skilled in the art that various modifications to the details of construction shown and described may be made without departing from the scope of this invention.

What is claimed is:

1. A system for reducing, in an aircraft borne magnetic detector, the effects of time variations in the total magnetic field caused by maneuvers of the aircraft, said system comprising:
   a) means for determining the magnetic properties of said aircraft and storing digital quantities in the form of bi-level electrical signals representative of such properties, and
   b) means responsive to the stored digital quantities representative of magnetic properties for producing signals to substantially cancel maneuver related signals in the output of said magnetic detector.

2. The system of claim 1 wherein said means for producing further comprises means for generating, in the vicinity of said magnetic detector, magnetic fields which are substantially equal in amplitude and opposite in orientation to the maneuver induced magnetic fields.

3. The system of claim 1 wherein said means for producing further comprises means for removing from the output signal of said magnetic detector, that portion of the total output signal which corresponds to maneuver induced magnetic field variations.

4. In a system for compensating in an airborne magnetic detector the effects of magnetic field variations caused by maneuvers of the aircraft, the combination which comprises:
   a) means for producing a first set of electrical signals in the form of digital quantities representative of the earth's magnetic field,
   b) means for producing a second set of electrical signals in the form of digital quantities representative of the instantaneous attitude of said aircraft, and
   c) means responsive to said first and second sets of electrical signals for producing and storing a third set of electrical signals in the form of digital quantities representative of the magnetic properties of said aircraft.

5. The combination of claim 4 wherein said means for producing a first set of electrical signals comprises a three-axis vector magnetometer.

6. The combination of claim 5 wherein said means for producing a second set of electrical signals comprises an aircraft reference system which produces signals representative of the aircraft heading, roll and pitch.

7. The combination of claim 4 further comprising means responsive to said third set of electrical signals for adding to the output of said magnetic detector a signal which substantially cancels those magnetic detector output components which result from aircraft maneuvers.

8. The combination of claim 4 further comprising means responsive to said third set of electrical signals for producing, in the vicinity of said magnetic detector, magnetic fields which substantially cancel the magnetic field components induced by aircraft maneuvers.

9. A magnetic compensator for use in connection with an airborne magnetic detector, said compensator comprising:
   a) means for producing first electrical signals representative of the earth's magnetic field,
   b) means for producing second electrical signals representative of the instantaneous attitude of the aircraft,
   c) processor means, responsive to said first and second electrical signals and to output signals from said magnetic detector for producing and storing a plurality of constant coefficients representative of the magnetic properties of said aircraft, said processor means being further responsive to said constant coefficients to operate on the output signal of said magnetic detector and substantially remove therefrom components resulting from aircraft maneuvers.

10. The compensator of claim 9 wherein said plurality of constant coefficients comprises a set of more than nine coefficients.

11. The compensator of claim 9 wherein said processor further comprises means for providing a plurality of intermediate coefficients each corresponding to a predetermined aircraft heading and maneuver and means responsive to said plurality of intermediate coefficient for providing said plurality of constant coefficients.

12. A method for substantially reducing the effects of maneuver induced signals in the output of an airborne magnetic detector, said method comprising:
   a) recording the output of said magnetic detector while the aircraft performs preselected maneuvers,
   b) generating, as a function of the recorded output signals, a second set of electrical signals representative of the magnetic properties of the aircraft, and
   c) generating, as a function of said second set of electrical signals, a third electrical signal to reduce, in the output of said magnetic detector, signal components resulting from aircraft maneuvers.

13. The method of claim 12 wherein said step of generating a third electrical signal further comprises inducing electrical currents in a coil system to provide, in the vicinity of said magnetic detector magnetic fields which are substantially equal to and in phase opposition to the maneuver induced magnetic field components.

14. The method of claim 12 wherein said step of generating a electrical signal further comprises producing a compensation electrical signal, substantially equal in amplitude and opposite in phase to the maneuver induced component of the magnetic detector output signal, and combining said compensation electrical signal with the magnetic detector output signal.

15. A method for suppressing maneuver signals in the output of an airborne magnetic detector comprising the steps of:
  a) performing a plurality of maneuvers with the aircraft, each along a preselected aircraft heading,
  b) recording the output of said magnetic detector during each of said maneuvers,
  c) processing the recorded output signals to provide electrical signals representative of the magnetic properties of said aircraft,
  d) measuring the attitude of said aircraft during subsequent maneuvers,
  e) combining the attitude measurements with said electrical signals to provide a compensation signal.

16. The method of claim 15 wherein said compensation signal produces compensating magnetic fields in the vicinity of said magnetic detector.

17. The method of claim 15 wherein said compensation signal is combined with the output signal of said magnetic detector to cancel maneuver signal components.

18. The method of claim 15 wherein the step of processing the recorded output signals further comprises the steps of:
  a) corresponding to each maneuver and heading of said aircraft, generating a first set of electrical signals each representative of an intermediate constant coefficient, and
  b) combining selected ones of said first set of electrical signals to produce a second set of electrical signals representative of the magnetic coefficients of the aircraft.

* * * * *